(12) United States Patent
Toujo (10) Patent No.: US 11,870,412 B2
(45) Date of Patent: Jan. 9, 2024

(54) MULTILAYER SUBSTRATE, CIRCUIT DEVICE, AND FILTER CIRCUIT SUBSTRATE

(71) Applicant: Murata Manufacturing Co., Ltd., Nagaokakyo (JP)

(72) Inventor: Atsushi Toujo, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 190 days.

(21) Appl. No.: 17/460,412

(22) Filed: Aug. 30, 2021

(65) Prior Publication Data

US 2021/0391841 A1    Dec. 16, 2021

Related U.S. Application Data

(63) Continuation of application No. PCT/JP2020/041686, filed on Nov. 9, 2020.

(30) Foreign Application Priority Data

Dec. 10, 2019    (JP) .................. 2019-222805

(51) Int. Cl.
*H03H 7/01* (2006.01)
*H01F 27/28* (2006.01)
*H01F 27/29* (2006.01)
*H01G 4/30* (2006.01)
*H05K 1/18* (2006.01)
*H03H 1/00* (2006.01)

(52) U.S. Cl.
CPC ....... *H03H 7/0115* (2013.01); *H01F 27/2804* (2013.01); *H01F 27/29* (2013.01); *H01G 4/30* (2013.01); *H05K 1/181* (2013.01); *H03H 2001/0085* (2013.01); *H05K 2201/1003* (2013.01); *H05K 2201/1006* (2013.01); *H05K 2201/10015* (2013.01)

(58) Field of Classification Search
CPC ................... H03H 2001/0085; H03H 7/0115
USPC .................................... 333/175, 185
See application file for complete search history.

(56) References Cited

U.S. PATENT DOCUMENTS 7,649,252 B2 * 1/2010 Sakai ............... H01L 25/165
257/703
2004/0080378 A1    4/2004 Furutani

FOREIGN PATENT DOCUMENTS

| JP | 2001-160728 A | 6/2001 |
| JP | 2001-320170 A | 11/2001 |
| JP | 2004-165633 A | 6/2004 |

(Continued)

OTHER PUBLICATIONS

Official Communication issued in International Patent Application No. PCT/JP2020/041686, dated Feb. 2, 2021.

*Primary Examiner* — Rakesh B Patel
(74) *Attorney, Agent, or Firm* — Keating & Bennett, LLP (57) ABSTRACT

A multilayer substrate includes a multilayer body, an internal wire, land electrodes, and a ground electrode. The internal wire extends toward the land electrode from a position where the internal wire overlaps the land electrode when viewed from a first surface and is electrically connected to the land electrode by a via conductor. The internal wire is electrically connected to the ground electrode by a via conductor that is provided in a region from a position where a capacitor is located where the via conductor at least partially overlaps the land electrode when viewed from the first surface.

19 Claims, 5 Drawing Sheets

(56) References Cited

FOREIGN PATENT DOCUMENTS

| | | |
|---|---|---|
| JP | 2004-222087 A | 8/2004 |
| JP | 2010-177591 A | 8/2010 |

\* cited by examiner

MULTILAYER SUBSTRATE, CIRCUIT DEVICE, AND FILTER CIRCUIT SUBSTRATE

CROSS REFERENCE TO RELATED APPLICATIONS

This application claims the benefit of priority to Japanese Patent Application No. 2019-222805 filed on Dec. 10, 2019 and is a Continuation Application of PCT Application No. PCT/JP2020/041686 filed on Nov. 9, 2020. The entire contents of each application are hereby incorporated herein by reference.

BACKGROUND OF THE INVENTION

1. Field of the Invention

The present disclosure relates to a multilayer substrate, a circuit device, and a filter circuit substrate.

2. Description of the Related Art

Noise countermeasures using a filter circuit substrate (hereinafter, also referred to as a filter circuit) are often provided for electronic devices. A filter circuit used for noise countermeasures, such as, for example, an EMI (Electro-Magnetic Interference) rejection filter, transmits a necessary component of current flowing in a conductor and eliminates an unnecessary component. Furthermore, such a filter circuit includes a capacitor, which is a capacitance element. It is thus known that a noise reduction effect is degraded by an equivalent series inductance (ESL: Equivalent Series Inductance), which is a parasitic inductance of the capacitor.

A technique for canceling the equivalent series inductance ESL of the capacitor by a negative inductance generated by magnetically coupling two coils and achieving the noise reduction effect of the filter circuit in a wider band is known (for example, Japanese Unexamined Patent Application Publication No. 2001-160728).

However, for example, in the case where a capacitor and the like are mounted on a circuit substrate, not only the equivalent series inductance ESL but an inductance component generated between a mounting surface and a GND electrode (ground electrode) wire also needs to be canceled in the filter circuit.

In particular, in the case where a passive element having a capacitor component, such as a capacitor, is mounted on a multilayer substrate, which is a circuit substrate, for example, another wire is provided between a mounting surface on which the passive element is mounted and the GND electrode. Thus, the distance between the mounting surface and the GND electrode is likely to be increased. As the distance between the mounting surface and the GND electrode increases, the influence of the inductance component generated between the mounting surface and the GND electrode increases, which may become a major obstacle for eliminating high-frequency noise in the filter circuit.

SUMMARY OF THE INVENTION

Preferred embodiments of the present invention provide multilayer substrates, circuit devices, and filter circuit substrates that are each able to reduce an influence of an inductance component generated between a mounting surface on which a passive element including a capacitor component is mounted and a ground electrode.

A multilayer substrate according to a preferred embodiment of the present disclosure includes a multilayer body including a plurality of insulating layers that are laminated on each other, an internal wire that is provided inside the multilayer body, a plurality of electrodes that are provided on a first surface of the multilayer body and are electrically connected to input and output terminals of a passive element including a capacitor component, and a ground electrode that is provided on a second surface of the multilayer body opposite the first surface or provided between the second surface and the internal wire. The internal wire extends towards a second electrode of the plurality of electrodes from a position where the internal wire overlaps a first electrode of the plurality of electrodes when the multilayer substrate is viewed from the first surface, is electrically connected to the first electrode by a first via conductor, and is electrically connected to the ground electrode by a second via conductor that at least partially overlaps the second electrode when the multilayer substrate is viewed from the first surface.

A circuit device according to a preferred embodiment of the present disclosure includes a passive element including a capacitor component and a multilayer substrate according to a preferred embodiment of the present invention, in which input and output terminals of the passive element are mounted on the plurality of electrodes.

A filter circuit substrate according to a preferred embodiment of the present disclosure includes a coil component including a first coil and a second coil that are magnetically coupled to each other, a capacitor that is connected to an electrode provided between the first coil and the second coil of the coil component, and a multilayer substrate according to a preferred embodiment of the present invention, in which the coil component and input and output terminals of the capacitor are mounted on the plurality of electrodes.

According to preferred embodiments of the present disclosure, the internal wire is electrically connected to the ground electrode by the second via conductor that at least partially overlaps the second electrode. Thus, the influence of an inductance component generated between the mounting surface on which the passive element is mounted and the ground electrode is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, multilayer substrates, circuit devices, and filter circuits according to preferred embodiments of the present invention will be described with reference to the drawings.

First Preferred Embodiment

Figure 1:
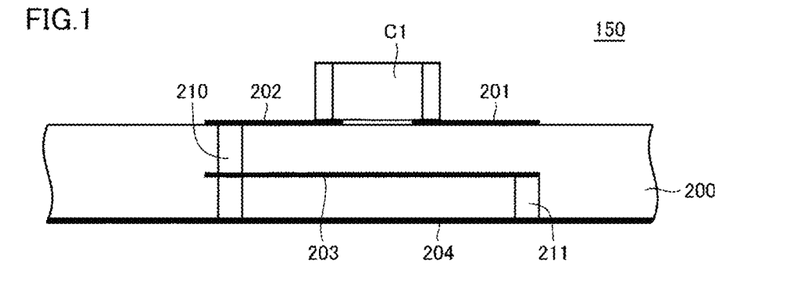
FIG. 1 is a cross-section view of a circuit device according to a first preferred embodiment of the present invention.
Figure 2:
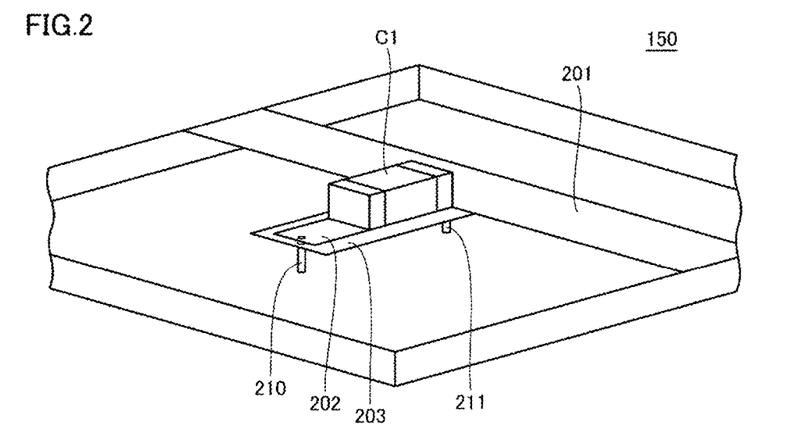
FIG. 2 is a perspective view of the circuit device according to the first preferred embodiment of the present invention.

A circuit device 150 according to a first preferred embodiment of the present invention will be described with reference to drawings. FIG. 1 is a cross-section view of the circuit device 150 according to the first preferred embodiment. FIG. 2 is a perspective view of the circuit device according to the first preferred embodiment. In the circuit device 150, a capacitor C1 is mounted on a surface of a multilayer substrate 200. On the surface of the multilayer substrate 200, land electrodes 201 and 202 on which the capacitor C1 is surface-mounted are provided. The land electrodes 201 and 202 are connected to input and output terminals of the capacitor C1. A circuit element mounted on the land electrodes 201 and 202 is not necessarily the capacitor C1. Any passive element including a capacitor component can be mounted on the land electrodes 201 and 202.

The land electrode 201 is included in a wiring pattern, as illustrated in FIG. 2. Thus, the land electrode 201 can be electrically connected to other circuit elements and a power supply circuit by the wiring pattern. The land electrode 202 is electrically connected, by a via conductor 210, to an internal wire 203 provided inside the multilayer substrate 200 and to a ground electrode 204 provided on a surface of the multilayer substrate 200 that is opposite the surface on which the land electrode 202 is provided. The ground electrode 204 may be provided between the surface of the multilayer substrate 200 that is opposite the surface on which the land electrode 202 is provided and the internal wire 203.

The internal wire 203 extends towards the land electrode 201 (a second electrode) from a position overlapping with the land electrode 202 (a first electrode) when viewed from the surface (a first surface) on which the land electrode 202 is provided. As is clear from FIG. 2, the area of the internal wire 203 is equal to or greater than the area of a region where the land electrode 202 and the capacitor C1 are provided. The internal wire 203 is electrically connected to the land electrode 202 by the via conductor 210 (a first via conductor) and is electrically connected to the ground electrode 204 by a via conductor 211 (a second via conductor) that at least partially overlaps the land electrode 201.

The multilayer substrate 200 includes a multilayer body including a plurality of insulating layers that are laminated on each other and is made of, for example, low-temperature co-fired ceramics, glass epoxy resin, or the like. The land electrodes 201 and 202 and the ground electrode 204 that are provided on the surfaces of the multilayer body and the internal wire 203 that is provided inside the multilayer body are made of metal that is typically used for electrodes, such as, for example, Cu, Ag, Al, or the like. Furthermore, the via conductors 210 and 211 are made of metal such as, for example, Ag, Cu, or the like.

The internal wire 203, the ground electrode 204, and the like are provided in layers of the multilayer substrate 200. The ground electrode 204 has a relatively large area so that no inductance component is generated. However, in the case of the multilayer substrate 200, since the distance between the mounting surface on which the capacitor C1 is mounted and the ground electrode 204 is large, an inductance component is generated between the mounting surface on which the capacitor C1 is mounted and the ground electrode 204. The generation of the inductance component may be a major obstacle to eliminate high-frequency noise in a filter circuit substrate (hereinafter, also referred to as a filter circuit).

A plurality of via conductors may be provided between the mounting surface on which the capacitor C1 is mounted and the ground electrode 204 so that an inductance component can be reduced. However, providing the plurality of via conductors between the mounting surface on which the capacitor C1 is mounted and the ground electrode 204 is not highly effective because a loop path of current flowing between the mounting surface on which the capacitor C1 is mounted and the ground electrode 204 cannot be largely changed.

Thus, in the multilayer substrate 200 according to the first preferred embodiment, the internal wire 203 is provided between the mounting surface on which the capacitor C1 is mounted and the ground electrode 204. The internal wire 203 is electrically connected, by the via conductor 210, to the land electrode 202 that is provided on the mounting surface on which the capacitor C1 is mounted. The internal wire 203 is also electrically connected to the ground electrode 204 by the via conductor 211.

As illustrated in FIG. 2, in the case of the multilayer substrate 200 including the internal wire 203, a loop path of current flowing in the order of the land electrode 201, the capacitor C1, the land electrode 202, the internal wire 203, and the ground electrode 204 is provided. In the case of the multilayer substrate 200 without the internal wire 203, a loop path of current flowing in the order of the land electrode 201, the capacitor C1, the land electrode 202, and the ground electrode 204 is provided. Thus, in the case of the multilayer substrate 200 including the internal wire 203, a smaller loop path in which current flows is provided. Furthermore, because the direction of the current flowing from the land electrode 201 to the land electrode 202 and the direction of the current flowing in the internal wire 203 are opposite to each other, mutual magnetic fluxes of these currents cancel each other out. Thus, the inductance component in the multilayer substrate 200 (circuit device 150) on which the capacitor C1 is mounted is reduced. That is, a feedback current flowing from the land electrode 202 to the ground electrode 204 passes through the internal wire 203, and an inductance component generated by the current flowing from the land electrode 201 to the land electrode 202 is thus canceled by an inductance component generated by the feedback current.

To cause the inductance component generated by the current flowing from the land electrode 201 to the land electrode 202 to be canceled by the inductance component generated by the feedback current, it is preferable that the distance between these currents is short. That is, to reduce the distance between the internal wire 203 and the land electrodes 201 and 202, the internal wire 203 extends towards the land electrode 201 from a position overlapping with the land electrode 202 when viewed from the surface on which the capacitor C1 is mounted.

The internal wire 203 is provided in a wiring layer of the multilayer substrate 200 that is near the surface on which the capacitor C1 is mounted (for example, a wiring layer that is closer to the capacitor C1 than the center of the multilayer substrate 200). Furthermore, it is preferable that the internal wire 203 is provided in the wiring layer of the multilayer substrate 200 that is closest to the surface on which the capacitor C1 is mounted. For example, in the case where the multilayer substrate 200 includes eight wiring layers, the internal wire 203 is provided in the second wiring layer that is closest to the surface on which the capacitor C1 is mounted (the first layer).

As described above, the multilayer substrate 200 according to the first preferred embodiment includes a multilayer body including a plurality of insulating layers that are laminated on each other, the internal wire 203 provided inside the multilayer body, the land electrodes 201 and 202 provided on a first surface of the multilayer body and electrically connected to the input and output terminals of the capacitor C1 including a capacitor component, and the ground electrode 204 provided on a second surface of the multilayer body that is opposite the first surface. The internal wire 203 extends towards the land electrode 201 from a position overlapping with the land electrode 202 when viewed from the first surface and is electrically connected to the land electrode 202 by the via conductor 210. The internal wire 203 is electrically connected to the ground electrode 204 by the via conductor 211 that at least partially overlaps the land electrode 201 when viewed from the first surface. Accordingly, in the multilayer substrate 200 according to the first preferred embodiment, in the case where the capacitor C1 is mounted on the land electrodes 201 and 202, an inductance component generated by current flowing in the land electrodes 201 and 202 is canceled by an inductance component generated by current flowing in the internal wire 203. Thus, the influence of an inductance component generated between the mounting surface on which the capacitor C1 is mounted the ground electrode can be reduced. The ground electrode 204 may be provided between the second surface and the internal wire 203.

The via conductor 210 may be electrically connected to the ground electrode 204. In this case, electrical connection between the internal wire 203 and the ground electrode 204 can be ensured. The via conductor 210 may be electrically connected to only the land electrode 202 and the internal wire 203. That is, as in the configuration illustrated in FIG. 1, the via conductor 210 does not necessarily penetrate through from the land electrode 202 to the ground electrode 204.

It is preferable that the internal wire 203 is provided in the wiring layer of the multilayer body that is closest to the first surface. With this configuration, in the multilayer substrate 200 according to the first preferred embodiment, in the case where the capacitor C1 is mounted on the land electrodes 201 and 202, the advantageous effect of canceling the inductance component generated by the current flowing in the land electrodes 201 and 202 by the inductance component generated by the current flowing in the internal wire 203 can be increased.

The circuit device 150 according to the first preferred embodiment includes the capacitor C1 and the multilayer substrate 200 in which the capacitor C1 is mounted on the land electrodes 201 and 202. Accordingly, in the circuit device 150 according to the first preferred embodiment, the inductance component generated by the current flowing in the land electrodes 201 and 202 is canceled by the inductance component generated by the current flowing in the internal wire 203. Thus, the influence of the inductance component generated between the mounting surface on which the capacitor C1 is mounted and the ground electrode can be reduced.

Second Preferred Embodiment

Figure 3:
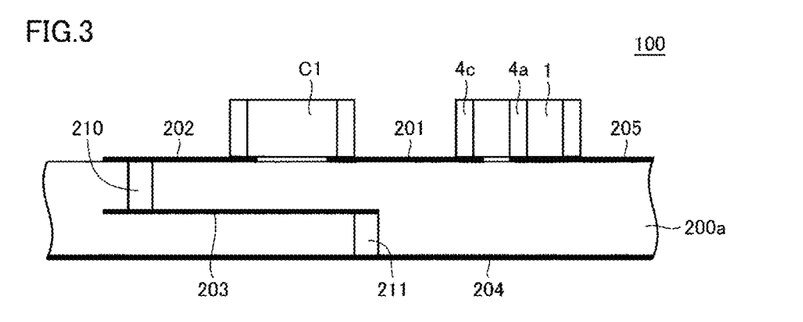
FIG. 3 is a cross-section view of a circuit device according to a second preferred embodiment of the present invention.
Figure 4:
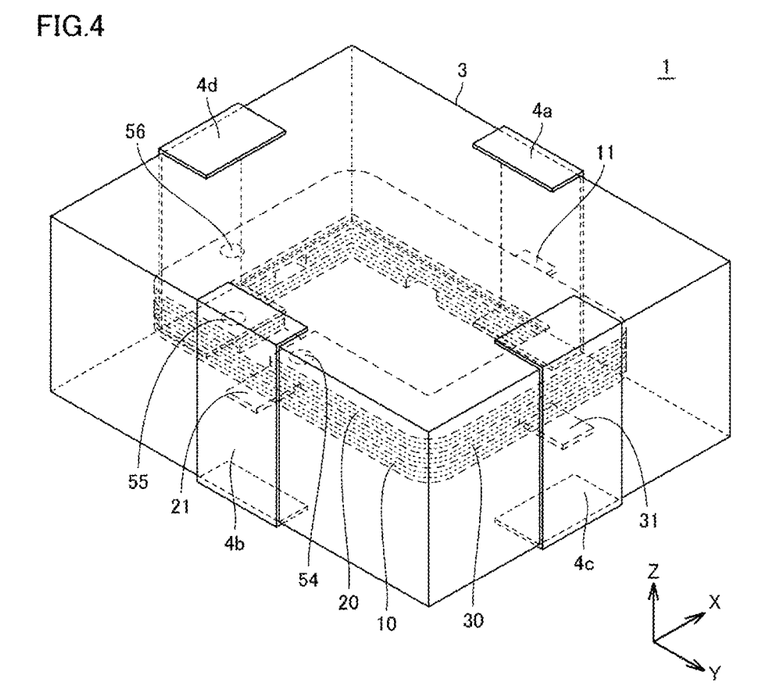
FIG. 4 is a perspective view of a coil component in the second preferred embodiment of the present invention.
Figure 5:
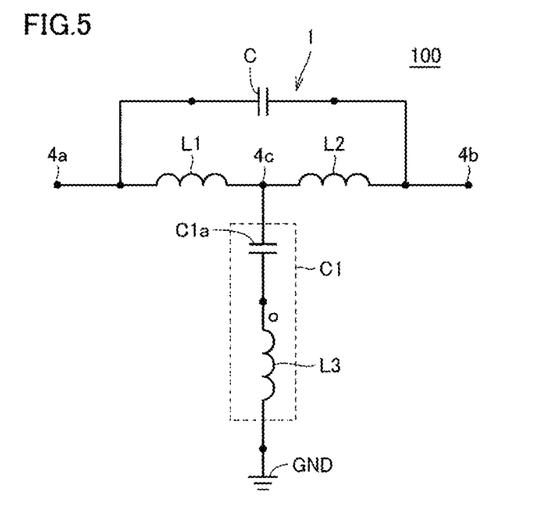
FIG. 5 is a circuit diagram of a filter circuit including the coil component in the second preferred embodiment of the present invention.

Regarding the circuit device 150 according to the first preferred embodiment, the configuration in which the single capacitor C1 is mounted on the multilayer substrate 200 has been described. In a circuit device according to a second preferred embodiment of the present invention, a filter circuit is configured such that a capacitor and a coil component are mounted on a multilayer substrate. FIG. 3 is a cross-section view of the circuit device according to the second preferred embodiment. FIG. 4 is a perspective view of a coil component in the second preferred embodiment. FIG. 5 is a circuit diagram of a filter circuit including the coil component in the second preferred embodiment. In FIG. 4, a short-side direction of a coil component 1 is represented by an X direction, a long-side direction of the coil component 1 is represented by a Y direction, and a height direction of the coil component 1 is represented by a Z direction. Furthermore, a lamination direction of the substrate is equal to the Z direction, and the direction of the arrow of the Z direction represents an upper layer direction. In a filter circuit 100 illustrated in FIG. 3, the same or corresponding components as those of the circuit device 150 illustrated in FIG. 1 will be referred to with the same reference signs, and detailed explanation for the same or corresponding components will not be repeated.

The filter circuit 100 is, for example, an EMI rejection filter and is a third-order T-type LC filter circuit. A multilayer substrate 200a is used for the filter circuit 100. In the second preferred embodiment, the configuration of the filter circuit 100 will be described with reference to a third-order T-type LC filter circuit. However, a multilayer substrate having a same or similar configuration may also be applied to a fifth-order T-type LC filter circuit or a higher-order T-type LC filter circuit, for example. First, as illustrated in FIG. 5, the filter circuit 100 includes the capacitor C1, electrodes 4a, 4b, and 4c, a coil L1 (a first coil), and a coil L2 (a second coil).

As illustrated in FIG. 5, one end portion of the capacitor C1 is connected to the electrode 4c, and the other end portion of the capacitor C1 is connected to a GND wire. The capacitor C1 may be, for example, a multilayer ceramic capacitor made of $BaTiO_3$ (barium titanate) as a main component, a multilayer ceramic capacitor made of other materials as a main component, or a capacitor of different types than multilayer ceramic capacitors, such as an aluminum electrolytic capacitor. The capacitor C1 includes an inductor L3 as a parasitic inductance (equivalent series inductance (ESL)) and is equivalent to a circuit configuration in which the inductor L3 is connected in series to a capacitor C1a. The capacitor C1 may also be equivalent to a circuit configuration in which a parasitic resistance (equivalent series resistance (ESR)) is connected in series to the inductor L3 and the capacitor C1a.

The coil L1 and the coil L2 as well as the capacitor C1 are connected to the electrode 4c. The coil L1 and the coil L2 are magnetically coupled to each other and generate a negative inductance component. By the negative inductance component, the parasitic inductance (inductor L3) of the capacitor C1 can be canceled, and an apparent inductance component of the capacitor C1 can be reduced. In the filter circuit 100 including the capacitor C1, the coil L1, and the coil L2, the parasitic inductance of the capacitor C1 is canceled by the negative inductance component caused by mutual inductances of the coil L1 and the coil L2, and the advantageous effect of reducing noise in a high-frequency band can thus be improved.

As illustrated in FIG. 4, the coil component 1 includes a ceramic multilayer body 3 (ceramic body) configured such that a plurality of substrates (ceramic green sheets) in which coil wires are provided are laminated. The multilayer body 3 includes a pair of main surfaces facing each other and side surfaces connecting the main surfaces. The coil L1 and the coil L2 are provided by laminating a plurality of first wiring patterns 10, a plurality of third wiring patterns 30, and a plurality of second wiring patterns in order from the bottom in parallel or substantially in parallel to the main surfaces of the multilayer body 3.

The side surfaces of the multilayer body 3 include a first side surface (a side surface on which the electrode 4a (a first electrode) is provided) and a second side surface (a side surface on which the electrode 4b (a second electrode) is provided) on the long sides and a third side surface (a side surface on which the electrode 4c (a third electrode) is provided) and a fourth side surface (a side surface on which the electrode 4d is provided) on the short sides.

In the coil component 1, the plurality of first wiring patterns 10, the plurality of second wiring patterns 20, and the plurality of third wiring patterns 30 that define the coils L1 and L2 are arranged inside the multilayer body 3. A portion of the plurality of third wiring patterns 30 defines the coil L1, and the remaining portion of plurality of third wiring patterns 30 defines the coil L2. That is, the plurality of third wiring patterns 30 define and function as a common portion of the coils L1 and L2. With the common portion of the coils L1 and L2, such as the plurality of third wiring patterns 30, variations in magnetic coupling between the coil L1 and the coil L2 can be reduced. The coil shapes of the coils L1 and L2 are in or substantially in line symmetry to each other with respect to the electrode 4c.

An end portion 11 of the first wiring pattern 10 in the lowest layer of the plurality of first wiring patterns 10 that are laminated in lower layers is electrically connected to the electrode 4a. The plurality of first wiring patterns 10 are electrically connected to one another by a via conductor (a first via conductor), which is not illustrated in FIG. 4. The first via conductor may be a single via conductor or may include a plurality of via conductors. Only at least one of the plurality of first wiring patterns 10 needs to be electrically connected to the electrode 4a.

An end portion 31 of the third wiring pattern 30 in the lowest layer of the plurality of third wiring patterns 30 that are laminated in middle layers is electrically connected to the electrode 4c. The plurality of third wiring patterns 30 are electrically connected to one another by a via conductor (a seventh via conductor), which is not illustrated in FIG. 4. The seventh via conductor may be a single via conductor or may include a plurality of via conductors. Only at least one of the plurality of third wiring patterns 30 needs to be electrically connected to the electrode 4c.

The third wiring patterns 30 that are laminated in the middle layers are electrically connected to the first wiring patterns 10 in the lower layers by via conductors (a second via conductor and a third via conductor), which are not illustrated in FIG. 4. A first wiring pattern 10 for which the second via conductor is provided and a first wiring pattern 10 for which the third via conductor is provided are on different side surfaces of the multilayer body 3. Specifically, the first wiring pattern 10 for which the second via conductor is provided is on the first side surface on the long side, and the first wiring pattern 10 for which the third via conductor is provided is on the fourth side surface on the short side, which is different from the first side surface, as illustrated in FIG. 4.

An end portion 21 of the second wiring pattern 20 in the lowest layer of the plurality of second wiring patterns 20 that are laminated in upper layers is electrically connected to the electrode 4b. The plurality of second wiring patterns 20 are electrically connected to one another by a via conductor 54 (a fourth via conductor). The via conductor 54 may be a single via conductor or may include a plurality of via conductors. Only at least one of the plurality of second wiring patterns 20 needs to be electrically connected to the electrode 4b.

The second wiring patterns 20 that are laminated in the upper layers are electrically connected to the third wiring patterns 30 in the middle layers by via conductors 55 and 56. Each of the via conductors 55 and 56 may be a single via conductor or may include a plurality of via conductors. The via conductors 55 and 56 are electrically connected to the plurality of second wiring patterns 20 and the plurality of third wiring patterns 30. Furthermore, a second wiring pattern 20 for which the via conductor 55 (a fifth via conductor) is provided and a second wiring pattern for which the via conductor 56 (a sixth via conductor) is provided are on different side surfaces of the multilayer body 3. Specifically, the second wiring pattern 20 for which the via conductor 55 is provided is on the second side surface on the long side, and the second wiring pattern 20 for which the via conductor 56 is provided is on the fourth side surface on the short side, which is different from the second side surface, as illustrated in FIG. 4.

Referring back to FIG. 3, in the filter circuit 100, the capacitor C1, and the coil component 1 are mounted on a surface of the multilayer substrate 200a. On the surface of the multilayer substrate 200a, land electrodes 201, 202, and 205 on which the capacitor C1 and the coil component 1 are mounted are provided. A circuit element mounted on the land electrodes 201 and 202 is not necessarily the capacitor C1, and any passive element including a capacitor component may be mounted on the land electrodes 201 and 202. A circuit element mounted on the land electrodes 202 and 205 is not necessarily the coil component 1, and any coil element in which two coils are magnetically coupled to each other may be mounted on the land electrodes 202 and 205.

The land electrode 205 is included in a wiring pattern. Thus, the land electrode 205 may be electrically connected to other circuit elements and a power supply circuit by the wiring pattern. The land electrode 205 is electrically connected, by the via conductor 210, to the internal wire 203 that is provided inside the multilayer substrate 200a. The land electrode 205 may be electrically connected, by the via conductor 210, to the ground electrode 204 that is provided on a surface of the multilayer substrate 200a that is opposite the surface on which the land electrode 202 is provided. The ground electrode 204 may be provided between the surface of the multilayer substrate 200a that is opposite the surface on which the land electrode 202 is provided and the internal wire 203.

The internal wire 203 extends towards the land electrode 201 (a second electrode) from a position overlapping with the land electrode 202 (a first electrode) when viewed from the surface (a first surface) on which the land electrode 202 is formed. The area of the internal wire 203 is equal to or greater than the area of a region where the land electrode 202 and the capacitor C1 are provided. The internal wire 203 is electrically connected to the land electrode 202 by the via conductor 210 (a first via conductor) and is electrically connected to the ground electrode 204 by the via conductor 211 (a second via conductor) that at least partially overlaps the land electrode 201.

In the coil component 1, the parasitic inductance of the capacitor C1 is canceled, and the advantageous effect of reducing noise in a high-frequency band can thus be improved. However, in the case where a inductance component is further generated between the mounting surface on which the capacitor C1 is mounted and the ground electrode 204, the combined inductance of the inductance component and the parasitic inductance of the capacitor C1 needs to be canceled by the coil component 1. Thus, in the filter circuit, the inductance component is a major obstacle to eliminate high-frequency noise. Furthermore, a large number of types of coil component 1 for canceling different values of inductance need to be prepared in accordance with specifications of the multilayer substrate on which the capacitor C1 is mounted.

Thus, in the case of the multilayer substrate 200a according to the second preferred embodiment, the internal wire 203 is provided between the mounting surface on which the capacitor C1 is mounted and the ground electrode 204. The internal wire 203 is electrically connected, by the via conductor 210, to the land electrode 202 that is provided on the mounting surface on which the capacitor C1 is mounted. The internal wire 203 is also electrically connected to the ground electrode 204 by the via conductor 211. Thus, in the case of the multilayer substrate 200a with the internal wire 203 provided, a smaller loop path in which current flows is provided. Furthermore, because the direction of current flowing from the land electrode 201 to the land electrode 202 and the direction of current flowing in the internal wire 203 are opposite to each other, mutual magnetic fluxes of these currents cancel each other out. Thus, the inductance component in the multilayer substrate 200a on which the capacitor C1 is mounted is reduced.

The reduction in the inductance component of the multilayer substrate 200a on which the capacitor C1 is mounted causes the inductance that needs to be canceled by the coil component 1 to be reduced. That is, with the use of the multilayer substrate 200a, only the type of the coil component 1 that mainly cancels the parasitic inductance of the capacitor C1 needs to be provided.

As described above, the internal wire 203 extends towards the land electrode 201 from the position overlapping with the land electrode 202 and is electrically connected to the ground electrode 204 by the via conductor 211 at a position at least partially overlapping with the land electrode 201. However, if the loop path in which current flows can be made to be small and current in the internal wire 203 can flow in the direction opposite to the direction of the current flowing from the land electrode 201 to the land electrode 202, the internal wire 203 may be electrically connected to the ground electrode 204 at any position.

Configurations in which the position where the internal wire 203 and the ground electrode 204 are electrically connected to each other is changed will be described below. FIGS. 6A to 6E include cross-section views of circuit devices for explaining a position where the internal wire 203 and the ground electrode 204 are electrically connected to each other. The same or corresponding components of the filter circuit 100 illustrated in FIGS. 6A to 6E as those of the circuit device 150 illustrated in FIG. 1 will be referred to with the same reference signs, and detailed explanation for those components will not be repeated.

Figure 6A:
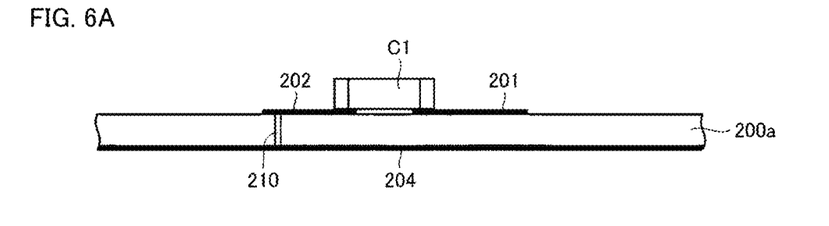
FIGS. 6A to 6E include cross-section views of circuit devices for explaining a position where an internal wire and a ground electrode are electrically connected to each other.
Figure 6B:
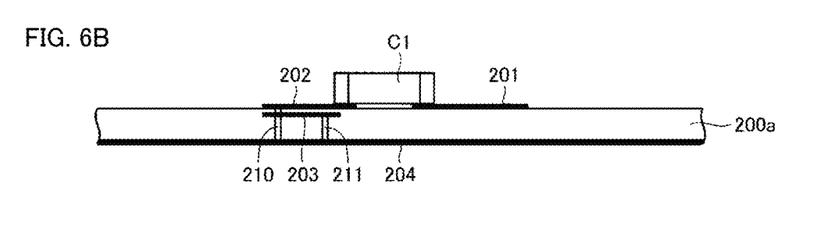
Figure 6C:
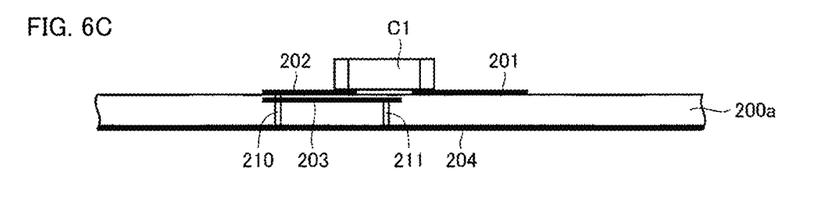
Figure 6D:
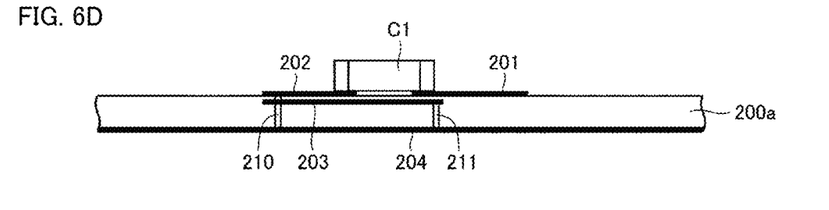
Figure 6E:
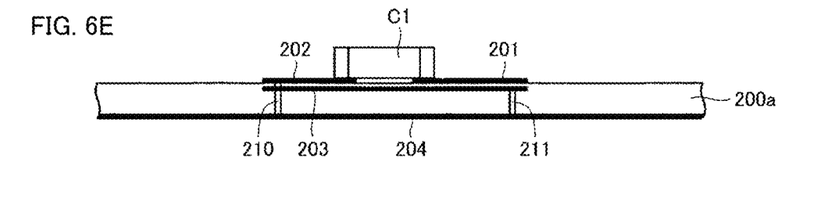
Figure 7:
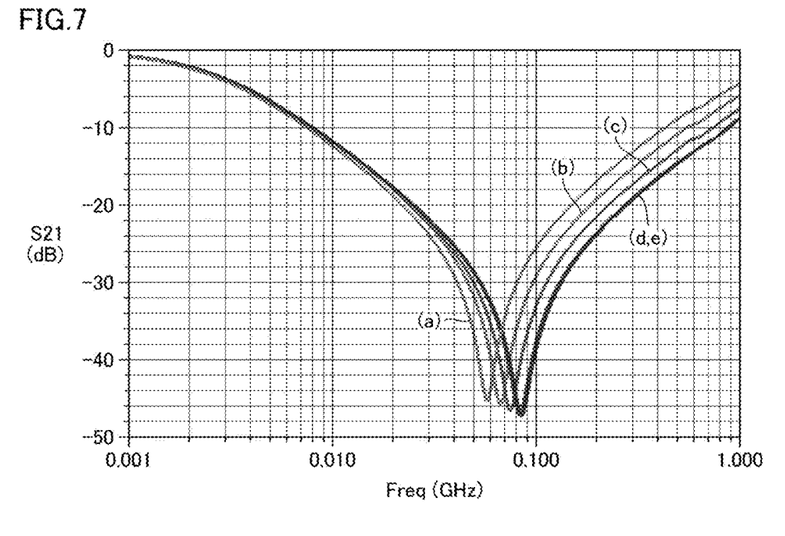
FIG. 7 includes graphs indicating transmission characteristics regarding the frequencies of the filter circuits illustrated in FIGS. 6A to 6E.

FIG. 7 includes graphs indicating transmission characteristics regarding the frequencies of the filter circuits illustrated in FIGS. 6A to 6E. In the graphs illustrated in FIG. 7, the horizontal axis represents frequency Freq (GHz), and the vertical axis represents transmission characteristics S21 (dB). In FIGS. 6A to 6E, illustration of the land electrode 205 and the coil component 1 is omitted.

In the filter circuit illustrated in FIG. 6A, which indicates a comparative configuration, the internal wire 203 is not provided. In the filter circuit illustrated in FIG. 6B, the internal wire 203 extends from a position overlapping with the land electrode 202 to a position where the electrode of the capacitor C1 and the land electrode 202 overlap, and the internal wire 203 and the ground electrode 204 are electrically connected to each other in the above-described portion by the via conductor 211. In the filter circuit illustrated in FIG. 6C, the internal wire 203 extends from the position overlapping with the land electrode 202 to a position overlapping with a center portion of the capacitor C1, and the internal wire 203 and the ground electrode 204 are electrically connected to each other in the above-described portion by the via conductor 211.

In the filter circuit illustrated in FIG. 6D, the internal wire 203 extends from the position overlapping with the land electrode 202 to a position where the electrode of the capacitor C1 and the land electrode 201 overlap, and the internal wire 203 and the ground electrode 204 are electrically connected to each other in the above-described portion by the via conductor 211. In the filter circuit illustrated in FIG. 6E, the internal wire 203 extends from the position overlapping with the land electrode 202 to a position overlapping with a far end of the land electrode 201, and the internal wire 203 and the ground electrode 204 are electrically connected to each other in the above-described portion by the via conductor 211.

In the graphs illustrated in FIG. 7, graph (a) indicates the transmission characteristics of the filter circuit with the configuration illustrated in FIG. 6A, graph (b) indicates the transmission characteristics of the filter circuit with the configuration illustrated in FIG. 6B, and graph (c) indicates the transmission characteristics of the filter circuit with the configuration illustrated in FIG. 6C. In the graphs illustrated in FIG. 7, graph (d) indicates the transmission characteristics of the filter circuit with the configuration illustrated in FIG. 6D, and graph (e) indicates the transmission characteristics of the filter circuit with the configuration illustrated in FIG. 6E.

As is clear from the graphs (a) to (d) illustrated in FIG. 7, as the internal wire 203 extends more towards the land electrode 201, a rapidly changing portion in the transmission characteristics S21 of the filter circuit is shifted in the direction getting closer to 0.100 GHz. That is, in the filter circuit 100, by extending the internal wire 203 further towards the land electrode 201, a reduction of noise in a higher frequency band can be achieved. Furthermore, as is clear from the graphs (d) to (e) illustrated in FIG. 7, rapidly changing portions in the transmission characteristics S21 of the filter circuits are in the same or substantially the same positions. That is, in the filter circuit 100, in the case where the internal wire 203 extends to a portion overlapping with a region of the land electrode 201 to which the capacitor C1 is connected, a band in which noise can be reduced is not changed even if the internal wire 203 extends further.

As described above, the filter circuit 100 according to the second preferred embodiment includes the coil component 1 including the coil L1 (a first coil) and the coil L2 (a second coil) that are magnetically coupled to each other, the capacitor C1 that is connected to the electrode 4c provided between the coil L1 and the coil L2 of the coil component 1, and the multilayer substrate 200a in which the coil component 1 and the capacitor C1 are mounted on the land electrodes 201, 202, and 205. Accordingly, in the filter circuit 100 according to the second preferred embodiment, the inductance component generated by the current flowing in the land electrodes 201 and 202 is canceled by the inductance component generated by the current flowing in the internal wire 203. Thus, the influence of the inductance component generated between the mounting surface on which the capacitor C1 is mounted and the ground electrode can be reduced, and a reduction of noise in a higher frequency band can be achieved.

In the multilayer substrate 200a, the internal wire 203 only needs to extend towards the land electrode 201 from the position overlapping with the land electrode 202 when the multilayer substrate 200a is viewed from the first surface and to be electrically connected to the ground electrode 204 by the via conductor 211 that is provided at a position so as to at least partially overlap with the land electrode 201 when the multilayer substrate 200a is viewed from the first surface. Accordingly, as is clear from the graphs (a) to (d) illustrated in FIG. 7, the filter circuit 100 including the multilayer substrate 200a can reduce noise in a higher frequency band.

Furthermore, it is preferable that the via conductor 211 at least partially overlaps a region of the land electrode 201 that is located at a position where the capacitor C1 is mounted. Accordingly, as is clear from the graphs (d) to (e) illustrated in FIG. 7, the filter circuit 100 including the multilayer substrate 200a can reduce noise in a higher frequency band.

Third Preferred Embodiment

Figure 8:
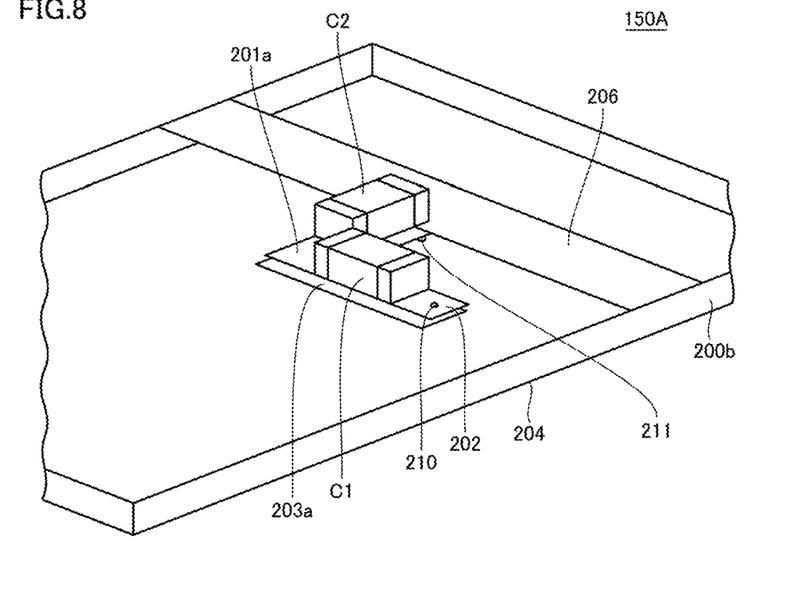
FIG. 8 is a perspective view of a circuit device according to a third preferred embodiment of the present invention.

Regarding the circuit device 150 according to the first preferred embodiment, the configuration in which the single capacitor C1 is mounted on the multilayer substrate 200 has been described. A circuit device according to a third preferred embodiment of the present invention is configured such that a plurality of capacitors are mounted on a multilayer substrate. FIG. 8 is a perspective view of the circuit device according to the third preferred embodiment. The same or corresponding components of a circuit device 150A illustrated in FIG. 8 as those of the circuit device 150 illustrated in FIG. 1 will be referred to with the same reference signs, and detailed explanation for those components will not be repeated. The circuit configuration in the third preferred embodiment may be combined with the circuit configuration in the second preferred embodiment.

In the circuit device 150A, the capacitor C1 and a capacitor C2 are mounted on a surface of a multilayer substrate 200b. On the surface of the multilayer substrate 200b, land electrodes 201a and 202 on which the capacitor C1 is surface-mounted and the land electrode 201a and a land electrode 206 on which the capacitor C2 is surface-mounted are provided. Circuit elements mounted on the land electrodes 201a, 202, and 206 are not necessarily the capacitors C1 and C2, and any passive element including a capacitor component may be mounted on the land electrodes 201a, 202, and 206.

As illustrated in FIG. 8, the land electrode 206 is included in a wiring pattern. Thus, the land electrode 206 can be electrically connected to other circuit elements and a power supply circuit by the wiring pattern. The land electrode 202 is electrically connected, by the via conductor 210, to an internal wire 203a provided inside the multilayer substrate 200b. The land electrodes 201a, 202, and 206 are arranged on the surface of the multilayer substrate 200b such that the capacitor C1 and the capacitor C2 define an L shape. The internal wire 203a is electrically connected to the ground electrode 204 provided on a surface of the multilayer substrate 200b that is opposite the surface on which the land electrode 202 is provided. The ground electrode 204 may be provided between the surface of the multilayer substrate 200b that is opposite the surface on which the land electrode 202 is provided and the internal wire 203a.

The internal wire 203a is provided, along the region where the capacitor C1 and the capacitor C2 are arranged, from a position overlapping with the land electrode 202 (a first electrode) when viewed from the surface (a first surface) on which the land electrode 202 is provided. Preferably, the internal wire 203a extends up to the land electrode 206 for the capacitor C2, which is the farthest, along the region where the capacitor C1 and the capacitor C2 are arranged, from the land electrode 202.

As is clear from FIG. 8, the area of the internal wire 203a is equal to or greater than the area of a region where the land electrode 202, the capacitor C1, and the capacitor C2 are provided. The internal wire 203a is electrically connected to the land electrode 202 by the via conductor 210 (a first via conductor) and is electrically connected to the ground electrode 204 by the via conductor 211 (a second via conductor) that at least partially overlaps the land electrode 206.

In the case of the multilayer substrate 200b including the internal wire 203a, a loop path of current flowing in the order of the land electrode 206, the capacitor C2, the land electrode 201a, the capacitor C1, the land electrode 202, the internal wire 203, and the ground electrode 204 is provided. In the case of the multilayer substrate 200b with the internal wire 203a provided, a smaller loop path in which current flows is provided. Furthermore, because the direction of the current flowing from the land electrode 206 to the land electrode 202 and the direction of the current flowing in the internal wire 203 are opposite to each other, mutual magnetic fluxes of these currents cancel each other out. Thus, the inductance component in the multilayer substrate 200b (circuit device 150A) on which the capacitor C1 and the capacitor C2 are mounted is reduced. That is, a feedback current flowing, along the region where the capacitor C1 and the capacitor C2 are arranged, from the land electrode 202 to the ground electrode 204 passes through the internal wire 203a, and an inductance component generated by the current flowing, along the region where the capacitor C1 and the capacitor C2 are arranged, from the land electrode 206 to the land electrode 202 is thus canceled by an inductance component generated by the feedback current.

As described above, in the multilayer substrate 200a according to the third preferred embodiment, the land electrodes 201a, 202, and 206 are provided on the first surface such that the capacitors C1 and C2 are connected in series. The internal wire 203a extends up to the land electrode 206 for the capacitor C2, which is the farthest, along the region where the capacitor C1 and the capacitor C2 are arranged, from the position where the internal wire 203a overlaps the land electrode 202 when viewed from the first surface. Accordingly, in the circuit device 150A according to the third preferred embodiment, the inductance component generated by the current flowing in the land electrodes 201a, 202, and 206 is canceled by the inductance component generated by the current flowing in the internal wire 203a. Thus, the influence of the inductance component generated between the mounting surface on which the capacitor C1 and the capacitor C2 are mounted and the ground electrode can be reduced. Although the case where two capacitors are mounted on the multilayer substrate 200a has been described above, three or more capacitors may be mounted on the multilayer substrate 200a. Furthermore, the capacitor C1 and the capacitor C2 may be connected in parallel to each other. In this case, the internal wire 203a may be arranged along each of the capacitor C1 and the capacitor C2 or may be arranged along one of the capacitor C1 and the capacitor C2.

Figure 9:
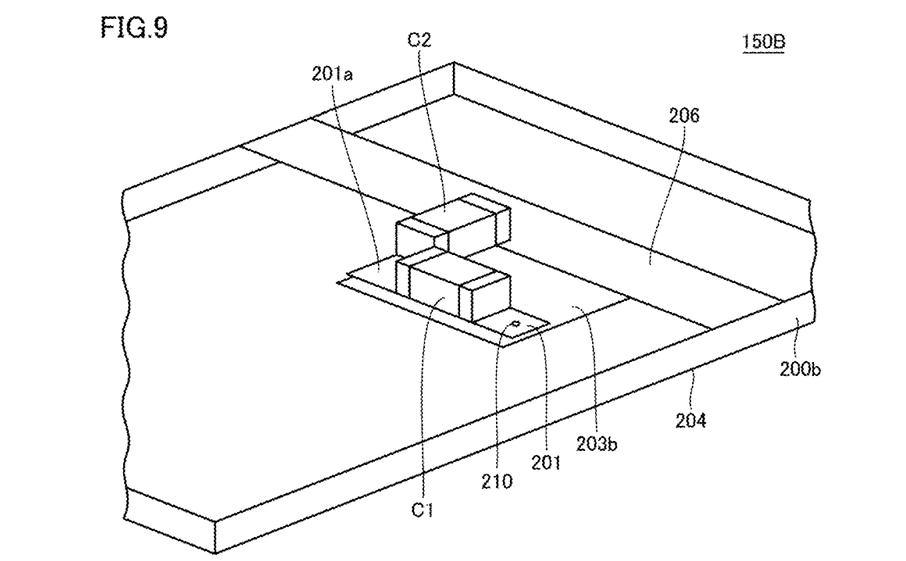
FIG. 9 is a perspective view of a circuit device according to a modification of the third preferred embodiment of the present invention.

The case where the internal wire 203a has a shape along the region where the capacitors C1 and C2 are arranged has been described above. However, the internal wire 203a may be a flat plate shape including the region where the capacitors C1 and C2 are arranged. FIG. 9 is a perspective view of a circuit device according to a modification of the third preferred embodiment of the present invention. The same or corresponding components of a circuit device 150B illustrated in FIG. 9 as those of the circuit device 150 illustrated in FIG. 1 will be referred to with the same reference signs, and detailed explanation for those components will not be repeated.

In the circuit device 150B, the capacitor C1 and the capacitor C2 are mounted on a surface of the multilayer substrate 200b. On the surface of the multilayer substrate 200b, the land electrodes 201a and 202 on which the capacitor C1 is surface-mounted and the land electrodes 201a and 206 on which the capacitor C2 is surface-mounted are provided.

An internal wire 203b has a flat plate shape in a region including a position where the internal wire 203b overlaps the land electrode 202 when viewed from the first surface and a region where the capacitor C1 and the capacitor C2 are arranged. The internal wire 203b is electrically connected to the land electrode 202 by the via conductor 210 (a first via conductor) and is electrically connected to the ground electrode 204 by the via conductor 211 (a second via conductor), which is not illustrated in FIG. 9, that at least partially overlaps the land electrode 206.

Figure 10:
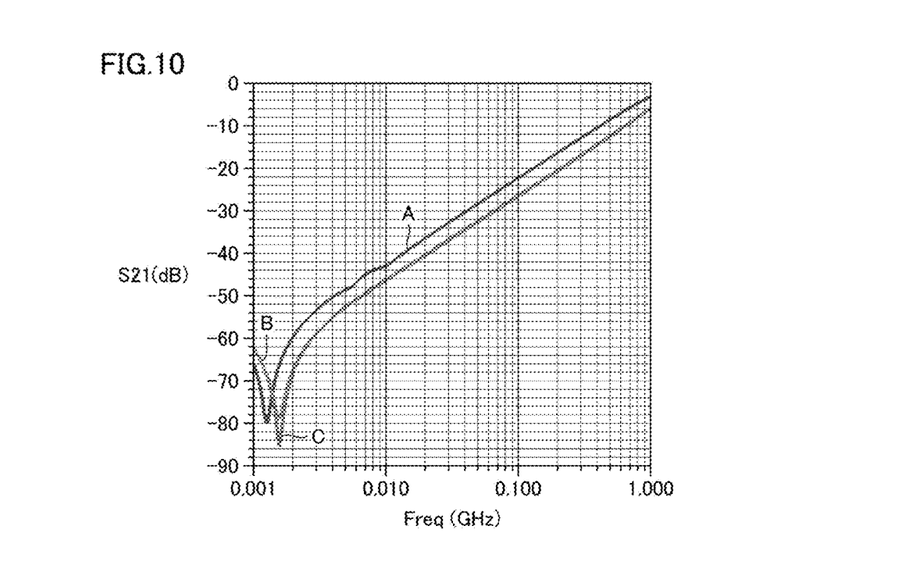
FIG. 10 includes graphs indicating transmission characteristics regarding the frequencies of the circuit device according to the third preferred embodiment of the present invention.

FIG. 10 includes graphs indicating transmission characteristics regarding the frequencies of the circuit device according to the third preferred embodiment. In the graphs illustrated in FIG. 10, the horizontal axis represents frequency Freq (GHz), and the vertical axis represents transmission characteristics S21 (dB). In the graphs illustrated in FIG. 10, graph (A) indicates the transmission characteristics of a circuit device that does not include an internal wire, graph (B) indicates the transmission characteristics of the circuit device with the configuration illustrated in FIG. 8, and graph (C) indicates the transmission characteristics of the circuit device with the configuration illustrated in FIG. 9.

As is clear from the graphs (A) to (C) illustrated in FIG. 10, rapidly changing portions in the transmission characteristics S21 of the circuit devices are shifted in the direction of getting closer to 0.002 GHz. That is, with the internal wires 203a and 203b, the circuit devices can reduce noise in a higher frequency band. Furthermore, as is clear from the graphs (B) to (C) illustrated in FIG. 10, portions in which the transmission characteristics S21 of circuit devices rapidly decrease are in the same or substantially the same positions. That is, in the circuit devices, a band in which noise can be reduced is the same or substantially the same regardless of whether the internal wires 203a and 203b have a shape along the region where the capacitors C1 and C2 are arranged or have a flat plate shape.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
a multilayer body including a plurality of insulating layers that are laminated on each other;
an internal wire inside the multilayer body;
a plurality of electrodes on a first surface of the multilayer body and electrically connected to input and output terminals of a passive element including a capacitor component; and
a ground electrode on a second surface of the multilayer body opposite the first surface or between the second surface and the internal wire; wherein
the internal wire:
extends toward a second electrode of the plurality of electrodes from a position where the internal wire overlaps a first electrode of the plurality of electrodes when the multilayer substrate is viewed from the first surface;
is electrically connected to the first electrode by a first via conductor; and
is electrically and physically connected to the ground electrode by a second via conductor at a position at least partially overlapping the second electrode when the multilayer substrate is viewed from the first surface.

2. The multilayer substrate according to claim 1, wherein the first via conductor is electrically connected to the ground electrode.

3. The multilayer substrate according to claim 1, wherein
in the multilayer body, a plurality of the passive elements are provided, and the plurality of passive elements are connected in series with each other on the first surface; and
the internal wire extends to the second electrode of a farthest passive element, along a region where the plurality of passive elements are provided, from the position where the internal wire overlaps the first electrode when the multilayer substrate is viewed from the first surface.

4. The multilayer substrate according to claim 1, wherein the second via conductor at least partially overlaps a region of the second electrode that is located at a position where the passive element is located.

5. The multilayer substrate according to claim 1, wherein the internal wire has a flat plate shape including a region from a position where the passive element is located to the second electrode when the multilayer substrate is viewed from the first surface.

6. The multilayer substrate according to claim 1, wherein the internal wire is provided in a wiring layer of the multilayer body closest to the first surface of the multilayer body.

7. A circuit device comprising:
the passive element including the capacitor component; and the multilayer substrate according to claim 1 in which the input and output terminals of the passive element are on the plurality of electrodes.

8. The circuit device according to claim 7, wherein the first via conductor is electrically connected to the ground electrode.

9. The circuit device according to claim 7, wherein
in the multilayer body, a plurality of the passive elements are provided, and the plurality of passive elements are positioned in series to each other on the first surface; and
the internal wire to extends to the second electrode of a farthest passive element, along a region where the plurality of passive elements are provided, from the position where the internal wire overlaps the first electrode when the multilayer substrate is viewed from the first surface.

10. The circuit device according to claim 7, wherein the second via conductor at least partially overlaps a region of the second electrode that is located at a position where the passive element is located.

11. The circuit device according to claim 7, wherein the internal wire has a flat plate shape including a region from a position where the passive element is located to the second electrode when the multilayer substrate is viewed from the first surface.

12. The circuit device according to claim 7, wherein the internal wire is provided in a wiring layer of the multilayer body closest to the first surface of the multilayer body.

13. A filter circuit substrate comprising:
a coil component including a first coil and a second coil that are magnetically coupled to each other;
a capacitor that is connected to an electrode provided between the first coil and the second coil of the coil component; and
the multilayer substrate according to claim 1 in which the coil component and input and output terminals of the capacitor are on the plurality of electrodes; wherein
the capacitor is provided by the passive element.

14. The filter circuit substrate according to claim 13, wherein the first via conductor is electrically connected to the ground electrode.

15. The filter circuit substrate according to claim 13, wherein
in the multilayer body, a plurality of the passive elements are provided, and the plurality of passive elements are in series with each other on the first surface; and
the internal wire to extends to the second electrode of a farthest passive element, along a region where the plurality of passive elements are provided, from the position where the internal wire overlaps the first electrode when the multilayer substrate is viewed from the first surface.

16. The filter circuit substrate according to claim 13, wherein the second via conductor at least partially overlaps a region of the second electrode that is located at a position where the passive element is located.

17. The filter circuit substrate according to claim 13, wherein the internal wire has a flat plate shape including a region from a position where the passive element is located to the second electrode when the multilayer substrate is viewed from the first surface.

18. The filter circuit substrate according to claim 13, wherein the internal wire is provided in a wiring layer of the multilayer body closest to the first surface of the multilayer body.

19. A multilayer substrate comprising:
a multilayer body including a plurality of insulating layers that are laminated on each other;
an internal wire inside the multilayer body;
a plurality of electrodes on a first surface of the multilayer body and electrically connected to input and output terminals of a passive element including a capacitor component; and
a ground electrode on a second surface of the multilayer body opposite the first surface or between the second surface and the internal wire; wherein
the internal wire:
extends toward a second electrode of the plurality of electrodes from a position where the internal wire overlaps a first electrode of the plurality of electrodes when the multilayer substrate is viewed from the first surface;
is electrically connected to the first electrode by a first via conductor; and
is electrically connected to the ground electrode by a second via conductor at a position at least partially overlapping the second electrode when the multilayer substrate is viewed from the first surface; and
at least one of the first via conductor and the second via conductor does not overlap with the passive element when the multilayer substrate is viewed from the first surface.

* * * * *